United States Patent
Dubey et al.

(10) Patent No.: US 10,797,016 B2
(45) Date of Patent: Oct. 6, 2020

(54) METHOD FOR BONDING SEMICONDUCTOR CHIPS TO A LANDING WAFER

(71) Applicants: IMEC VZW, Leuven (BE); Katholieke Universiteit Leuven, Leuven (BE)

(72) Inventors: Vikas Dubey, Leuven (BE); Eric Beyne, Heverlee (BE); Giovanni Capuz, Boutersem (BE)

(73) Assignees: IMEC vzw, Leuven (BE); Katholieke Universiteit Leuven, Leuven (BE)

( * ) Notice: Subject to any disclaimer, the term of this patent is extended or adjusted under 35 U.S.C. 154(b) by 6 days.

(21) Appl. No.: 15/798,939

(22) Filed: Oct. 31, 2017

(65) Prior Publication Data
US 2018/0130765 A1    May 10, 2018

(30) Foreign Application Priority Data

Nov. 9, 2016   (EP) .................................... 16197994

(51) Int. Cl.
*H01L 23/00* (2006.01)

(52) U.S. Cl.
CPC .............. *H01L 24/83* (2013.01); *H01L 24/29* (2013.01); *H01L 24/32* (2013.01); *H01L 24/75* (2013.01); *H01L 24/94* (2013.01); *H01L 2224/037* (2013.01); *H01L 2224/03318* (2013.01); *H01L 2224/03901* (2013.01); *H01L 2224/29186* (2013.01); *H01L 2224/32145* (2013.01); *H01L 2224/32245* (2013.01); *H01L 2224/8002* (2013.01); *H01L 2224/80143* (2013.01); *H01L 2224/80169* (2013.01); *H01L 2224/80355* (2013.01); *H01L 2224/80908* (2013.01); *H01L 2224/80986* (2013.01); *H01L 2224/83002* (2013.01); *H01L 2224/83143* (2013.01); *H01L 2224/83896* (2013.01)

(58) Field of Classification Search
CPC . H01L 2224/83143; H01L 2224/83896; H01L 2224/03318; H01L 2224/0331–0332; H01L 2224/80143
See application file for complete search history.

(56) References Cited

U.S. PATENT DOCUMENTS

2016/0233191 A1* 8/2016 Zhang ...................... H01L 24/92
2017/0345794 A1* 11/2017 Yu ............................ H01L 24/17

OTHER PUBLICATIONS

Klaver, Eric; Controlled Package on Package Placement; publication date unknown; document available for download from assembleon.com at least as early as Aug. 24, 2016; 7 pages.
(Continued)

*Primary Examiner* — Brigitte A Paterson
(74) *Attorney, Agent, or Firm* — Knobbe Martens Olson & Bear LLP

(57) ABSTRACT

A method for bonding chips to a landing wafer is disclosed. In one aspect, a volume of alignment liquid is dispensed on a wettable surface of the chip so as to become attached to the surface, after which the chip is moved towards the bonding site on the wafer, the bonding site equally being provided with a wettable surface. A liquid bridge is formed between the chip and the bonding site on the substrate wafer, enabling self-alignment of the chip. Dispensing alignment liquid on the chip and not the wafer is advantageous in terms of mitigating unwanted evaporation of the liquid prior to bonding.

11 Claims, 3 Drawing Sheets

(56) References Cited

OTHER PUBLICATIONS

Knuesel, et al.; Self-assembly of Microscopic Chiplets at a Liquid-liquid-solid Interface Forming a Flexible Segmented Monocrystalline Solar Cell; Proceedings of the National Academy of Sciences of the United States of America, Jan. 11, 2010, vol. 107, No. 3, pp. 993-998.

* cited by examiner

METHOD FOR BONDING SEMICONDUCTOR CHIPS TO A LANDING WAFER

CROSS-REFERENCE TO RELATED APPLICATIONS

This application claims foreign priority to European Patent Application No. 16197994.3, filed Nov. 9, 2016, the contents of which are incorporated by reference herein in its entirety.

BACKGROUND

Technological Field

The disclosed technology is related to the assembly of integrated circuit chips to a wafer. The wafer is also referred to as substrate wafer, landing wafer, carrier wafer or bottom wafer. The term "landing wafer" will be primarily used in this description.

Description of the Related Technology 3D integration of semiconductor chips (hereafter also referred to as dies or integrated circuits) by bonding chips to a landing wafer or to a die or stack of dies previously bonded to the wafer is known as "die-to-wafer (D2W)" bonding or stacking. This technology involves the accurate positioning of individual chips on predefined locations of a landing wafer, followed by the bonding of the chips to the wafer by a collective bonding approach. Accurate alignment of the chips can be facilitated by self-alignment of the chips to the landing wafer positions through the use of an alignment liquid. Water is often used for this purpose because it has high surface tension (72 mN/m) at room temperature and low viscosity (1 cP at 20° C.). Any other fluid with similar properties can also be used as alignment liquid. In present-day methods, self-alignment is achieved by producing bonding surfaces on the wafer and the chip which are wettable by the alignment liquid or which are rendered wettable through a suitable treatment (plasma treatment preferably), and by dispensing a droplet of the liquid on the bonding sites of the landing wafer, where the liquid is contained, for example a non-wettable boundary around the bonding site. The individual chips are coarsely aligned and placed over the liquid without squeezing the liquid out of the bonding site on the landing wafer. This creates a gap between the chip and the bonding surface of the landing wafer because of the liquid volume. After placement, the chip will self-align over the bonding site because of the capillary forces which are generated due to stress on the liquid-air interface. The water droplets will then evaporate resulting in well-aligned bonded chips on the wafer.

In order for this process to work in a time-efficient manner, the above-described process involves the deposition of a large number of droplets on the wafer, followed by the sequential pick-and-place of the chips onto the wafer. This, however, holds the risk of unwanted evaporation of droplets between the time of the droplet dispensing and the chip placement. During this time, droplets which have been dispensed on the wafer are exposed to the environment, and part of the droplet volume evaporates. The evaporation will lead to a variation in liquid volume across different bonding sites on the landing wafer for alignment of chips. This variation in liquid volume can lead to a large deviation in alignment accuracies of the chips thereby affecting the overall process. Hence, a good liquid volume control is critical to obtaining low standard deviation in the alignment accuracy of the chips with respect to the bonding sites.

Summary of Certain Inventive Aspects

The disclosed technology aims to provide a method for self-alignment and bonding of chips to bonding sites on a landing wafer in which the above-described problem of unwanted evaporation is overcome. According to methods of the disclosed technology, a volume of alignment liquid is dispensed on a wettable surface of the chip so as to become attached to the surface because of the liquid affinity to the surface, after which the chip is moved towards the bonding site on the wafer, the bonding site equally being provided with a wettable surface. A liquid bridge is formed between the chip and the bonding site on the wafer during placement, enabling self-alignment of the chip.

Dispensing alignment liquid on the chip and not the wafer is advantageous as it allows a better volume control of the alignment liquid during the self-alignment process, which is beneficial in terms of mitigating unwanted evaporation of the liquid prior to placement of the chips. Also, the integration of the dispensing and placement process reduces the overall process time as it eliminates the alignment time (time taken by the droplet dispensing tool to align to the bonding sites prior to placement of the chip).

The disclosed technology is thus related to a method for bonding one or more individual semiconductor chips to a landing wafer, the chips including a chip bonding surface that is at least partially wettable by an alignment liquid, the wafer including one or more bonding sites respectively configured to receive the one or more chips, the bonding sites having a bonding surface that is at least partially wettable by the alignment liquid, the method including the following steps:

a volume of the alignment liquid is dispensed on the bonding surface of a chip, the liquid volume spreading out across the chip bonding surface or a wettable portion thereof while being contained to the bonding surface, thereafter, the chip is positioned above the bonding surface of a bonding site of the landing wafer in such a manner that the alignment liquid spreads out across both wettable bonding surfaces or wettable portions thereof, while being contained to the surfaces, so that the liquid establishes a self-alignment of the chip to the bonding site. The chip is positioned above the bonding site and not in physical contact with the bonding site, so that a liquid bridge forms between the bonding surfaces or the wettable portions thereof, the preceding steps are repeated for additional chips, if applicable, the one or more chips are bonded to the respective bonding sites.

The wettable portions of the bonding surfaces on the chip on the one hand and on the bonding site on the other are complementary to each other. This means that, in some embodiments, these wettable portions (either the full bonding surfaces if they are wettable as a whole, or the wettable portions of the bonding surfaces) have essentially the same shape. The size of the complementary wettable portions may be the same or they may be different to a degree that still allows the self-alignment.

According to an embodiment, the bonding surfaces are the surfaces of bonding layers on the one or more chips and on the one or more bonding sites. The bonding layers may be layers suitable for applying a direct bonding or hybrid bonding technique.

According to another embodiment, the method includes the steps of:
- picking up a chip with a chip holder, wherein the chip bonding surface is oriented away from the holder,
- supplying an alignment liquid through an orifice of a droplet dispensing apparatus, so that a volume of the liquid becomes attached to the orifice through the surface tension of the liquid, at least part of the volume extending outward from the orifice,
- moving the chip so that the chip bonding surface approaches the volume of alignment liquid until the liquid spreads across the chip bonding surface or a wettable portion thereof, while being contained to the surface,
- moving the chip away from the orifice or vice versa, so that at least part of the volume of alignment liquid remains attached to the chip bonding surface or to the wettable portion, moving the chip towards a position above a bonding site (i.e., not in physical contact with the bonding site) so that the liquid spreads across the bonding surface of the bonding site or a wettable portion thereof, while being contained to the two bonding surfaces. At this point, the liquid forms a liquid bridge between the bonding surfaces or the wettable portions thereof,
- releasing the chip from the holder, thereby establishing self-alignment of the chip to the bonding site,
- possibly repeating the previous steps with one or more additional chips,
- bonding the one or more chips to the landing wafer.

The droplet dispensing apparatus may include a tube through which the alignment liquid is supplied, wherein the orifice is the opening at the outer extremity of the tube.

According to an embodiment, the tube is held in a vertical position with the volume of alignment liquid attached at the top of the tube.

According to an embodiment, the volume of liquid attached to the orifice is calculated for each of the one or more chips, as the sum of V1 and V2, where:
- V1=the liquid volume required between the chip bonding surface and the wafer bonding surface in order for the chip to be self-aligned at a given height (h) above the wafer bonding surface, and
- V2=the amount of liquid expected to evaporate between the moment when the alignment liquid is first attached to the chip and the moment when the chip is released from the holder.

According to an embodiment, a difference between the volume attached at the extremity of the tube and the volume dispensed on the chip is computed and taken into account in the calculation of V1.

According to an embodiment, the bonding sites are located on the upper surface of chips that have been previously bonded to the landing wafer's surface or to other previously bonded chips.

DETAILED DESCRIPTION OF CERTAIN ILLUSTRATIVE EMBODIMENTS

In the following detailed description, a surface is said to be "wettable" by an alignment liquid, when a volume of the liquid applied to the surface spreads easily over the entire surface. The liquid may be water or any other suitable alignment liquid. A surface that is wettable by water is known as hydrophilic.

Figure 1A:
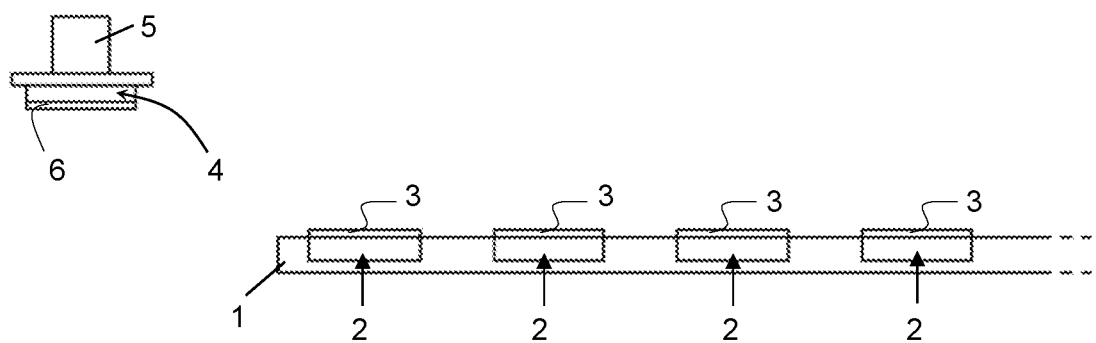
FIGS. 1A through 1H illustrate the method of the disclosed technology according to one embodiment.

According to the method of the disclosed technology, the bonding surfaces of the chip and of the bonding sites on the wafer are at least partially wettable by a given alignment liquid, possibly rendered (more) wettable by a plasma treatment, as in the prior art. Contrary to the prior art methods however, the method of the disclosed technology includes the step of dispensing a droplet of alignment liquid on the bonding surface of the chip prior to placement of the chip on the wafer. FIGS. 1A through 1H illustrate the steps of the method according to one embodiment. A landing wafer 1 is provided, having a plurality of bonding sites 2 (FIG. 1A). These sites include a bonding layer 3, the bonding layer having an upper surface that is wettable by an alignment liquid. A chip 4 is picked up by a movable chip holder 5. The chip is equally provided with a bonding layer 6 having equally a surface that is wettable by the same alignment liquid. The bonding layers 3 and 6 may be dielectric layers suitable for direct dielectric-to-dielectric bonding, for example SiCN layers or $SiO_2$ layers. The method is, however, applicable to any known bonding technique, such as hybrid bonding where dielectric bonding layers are used with metal areas embedded in the bonding layers so that the bonding surfaces include dielectric and metal areas. In the latter case, where the metal areas are small compared to the dielectric areas, it is possible that only the dielectric areas of the bonding surfaces are wettable by the alignment liquid. This is a case, therefore, where the bonding surfaces are partially wettable. It is required, however, that a sufficiently large part of the bonding surfaces are wettable in order for the alignment of the two bonding surfaces to be possible.

In the non-limiting example of FIGS. 1A through 1H, the totality of the bonding surfaces is wettable. The bonding surfaces of the layers 3 and 6 on the chip 4 and the wafer 1 are therefore wettable by the alignment liquid. At the same time, the chip 4 and the wafer 1 are configured to prevent alignment liquid dispensed on these surfaces from flowing beyond these surfaces. The liquid is contained on the bonding surfaces in any manner known in the art. On the bonding sites 2 of the wafer 1, this may be done by creating a wettability contrast. This may be obtained by using a non-wettable material around the bonding surface, for example a polymer (high water contact angle) surrounding a SiCN or $SiO_2$ layer (low water contact angle). Another way is by using the effect of edge pinning, by producing bonding sites 2 protruding outward from the surface of the wafer or by using a step effect: bonding sites 2 which are lying inward of the surface of the wafer. Edge pinning is preferably the effect applied for confining the alignment liquid to the chip. In some cases, the bonding surfaces of the chip 4 on the one hand and each of the bonding sites 2 on the other are complementary, i.e., they are equal shaped.

Figure 1B:
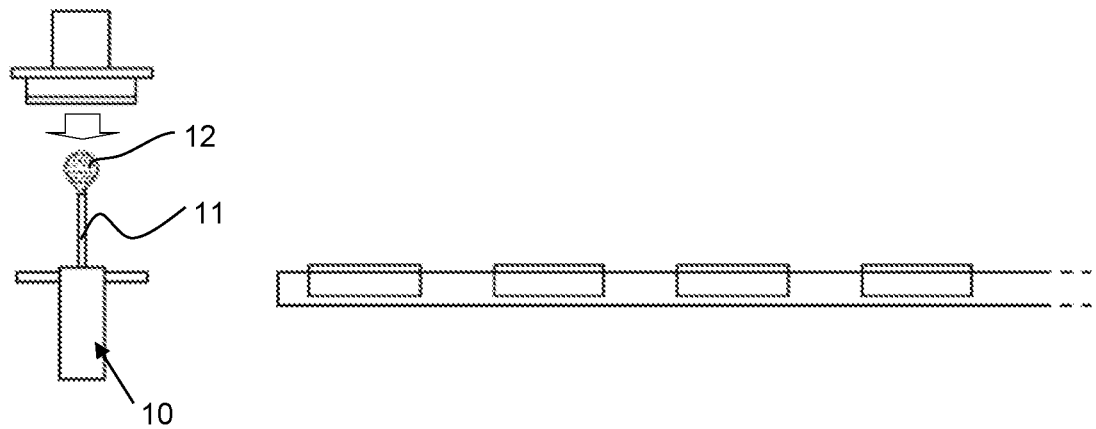
Figure 1C:
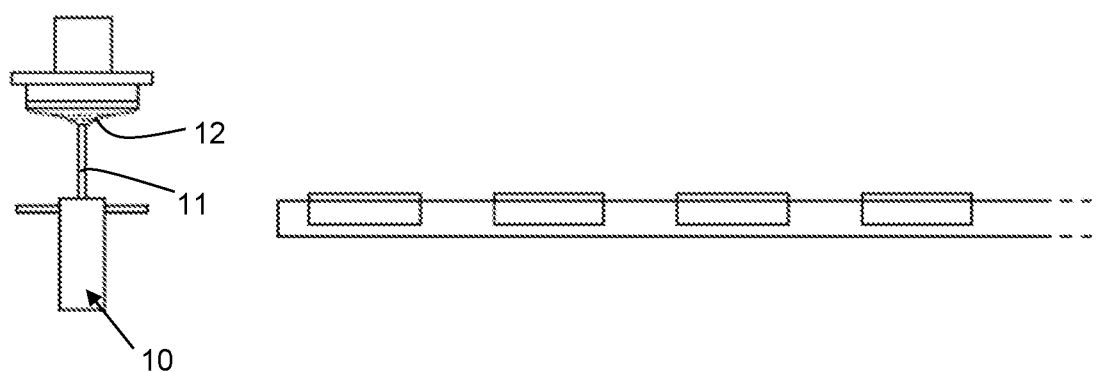
Figure 1D:
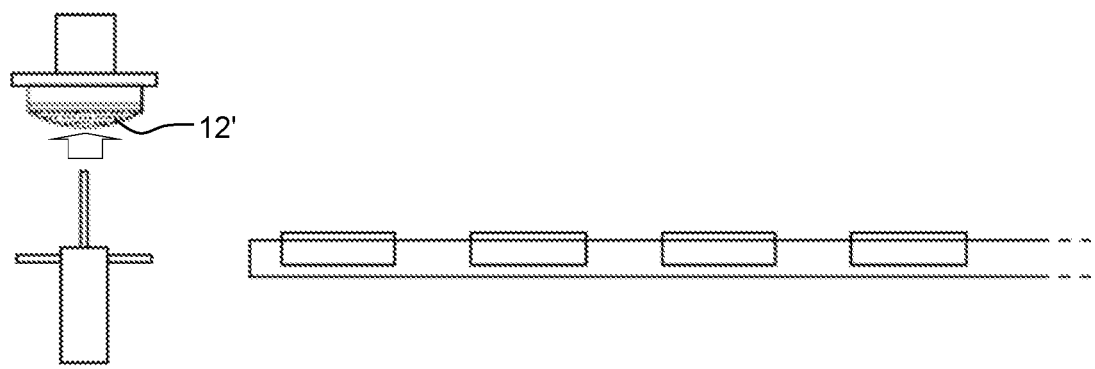

The chip holder 5 can be any tool known in the art for pick-and-place operations. After picking up the chip 4 from a temporary carrier or tape (not shown), the chip holder 5 moves the chip towards a droplet dispensing apparatus 10 (FIG. 1B), with the chip bonding surface oriented away from the holder 5. The dispensing apparatus 10 may include a hollow tube 11, capable of allowing the passage of an alignment liquid through the tube and maintaining a droplet 12 of this liquid at the outer extremity of the tube, the droplet 12 extending at least partially outward from the tube. The droplet 12 is maintained on the outer extremity of the tube by the surface tension of the liquid volume. Preferably the tube 11 is held vertically upward while the droplet 12 is maintained on top of the tube. The chip holder 5 is then manipulated so that the chip approaches the droplet 12 from above, as illustrated in FIG. 1B. As soon as the droplet contacts the bonding surface of the chip, the wettability causes the droplet to spread across the chip's bonding surface (FIG. 1C). The chip holder 5 then moves away from the dispenser 10 or vice versa, so that a droplet 12' remains attached to the downward facing chip bonding surface, through the surface tension effect (FIG. 1D). The volume of the droplet 12' is at least equal to the volume of the droplet 12 attached to the tube 11 prior to the actual dispensing of the liquid onto the chip bonding surface.

A droplet dispenser 10 that is suitable for use in the method of the disclosed technology may be any apparatus that is known in the art for dispensing droplets onto a horizontal wafer surface from above. The dispenser need not necessarily be equipped with a tube 11. Other dispenser types are known in the art. A device suitable for use in the disclosed technology is provided with an orifice (for example the outer end of the tube 11) configured to supply and maintain a droplet of liquid in a controlled manner with at least part of the droplet extending away from the orifice. In some embodiments, the material of the orifice has low surface energy compared to the wettable material onto which the liquid is to be dispensed. For example, when water is used as the alignment liquid, the orifice is preferably hydrophobic. In some cases, it may be preferable to apply a higher diameter of the orifice and/or a higher wall thickness of the tube 11 in case a tube is used, compared to an orifice/tube used for dispensing a droplet of a given size on a horizontal surface from above. These measures may be beneficial for ensuring that the droplet can be maintained by the orifice.

The characterizing dimension of the bonding surface of the chips that can be assembled by the method of the disclosed technology may vary from about 50 µm to several millimetres. The dimensions of the orifice/tube 11 are chosen in accordance with the chip dimensions, for example a wider tube for larger chips down to a hollow needle for micro-chips.

Figure 1E:
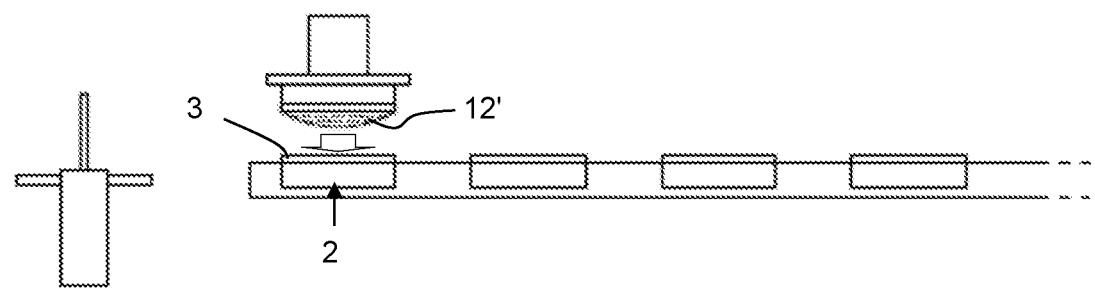
Figure 1F:
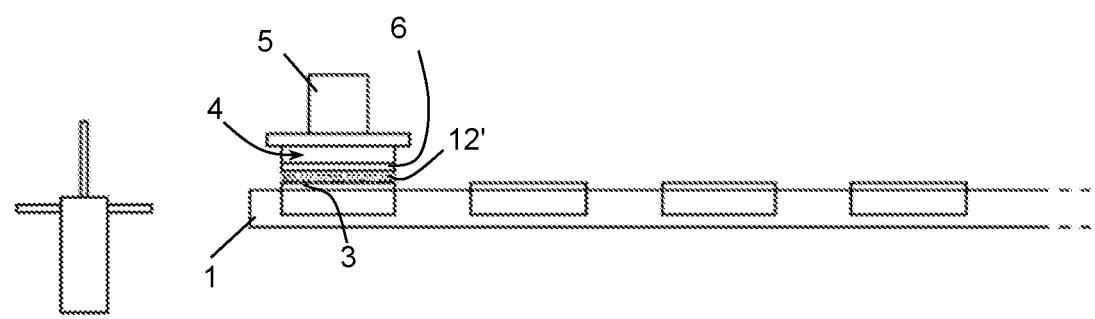
Figure 1G:
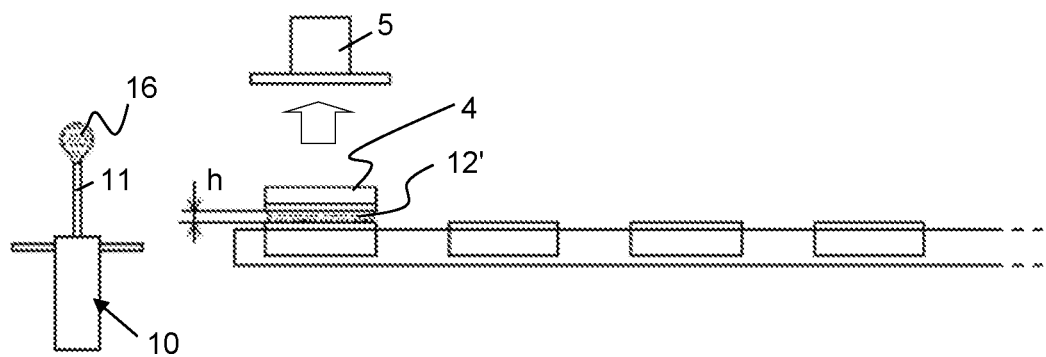
Figure 1H:
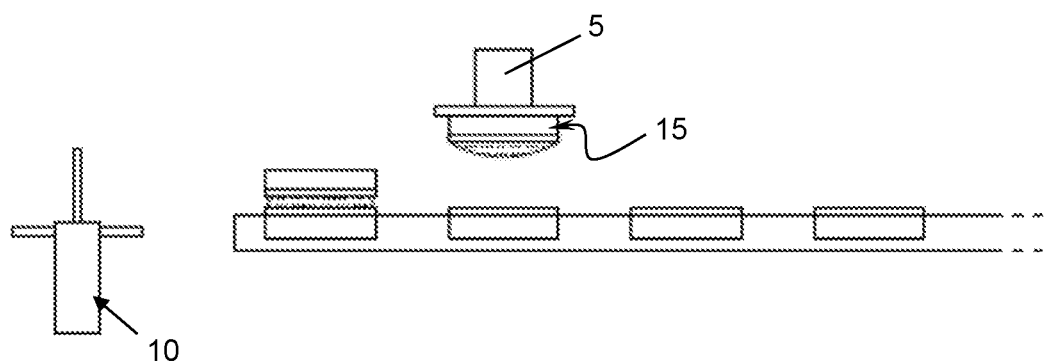

The chip 4, with the spread-out droplet 12' attached to its bonding surface is then transported by the movable holder 5 towards a bonding site 2 on the wafer (FIG. 1E). After a coarse alignment with the bonding site, the chip 4 is lowered to a position above the bonding site at which the droplet 12' makes contact with the wettable surface of the bonding layer 3 on the bonding site 2, but without physical contact between the bonding surfaces of the chip 4 and the bonding site 2. At that moment, the droplet 12' spreads out across this latter surface and now forms a liquid bridge that is attached uniformly to both wettable surfaces (FIG. 1F), while being contained to the surfaces through the containment mechanisms described above, for example wettability contrast for the bonding site and edge pinning for the chip bonding surface. Then the chip holder 5 releases the chip (FIG. 1G). As in the prior art methods where droplets are deposited on the wafer instead of the chips, the capillary forces which are generated by the stress on the liquid-air interface due to the placement of the chip enable the self-alignment of the chip to the wafer bonding site 2, with a liquid volume of a given height h extending between the bonding surfaces (see FIG. 1G).

The wafer holder 5 then picks up a second chip 15 (FIG. 1H), returns to the dispenser 10 to receive a second droplet 16 and moves the second chip to its dedicated wafer location. The process is repeated until a given number of chips are placed on the wafer, after which the collective bonding may be performed in a manner known in the art.

One major advantage of the method according to the disclosed technology lies in the fact that a droplet dispensed on the bonding surface of a chip is not exposed for prolonged and possibly unpredictable periods of time to the environment while being attached to that surface alone, thereby avoiding the above-described problem of unwanted evaporation. Once the droplet is held between two surfaces, spontaneous evaporation is prohibited or much more limited and will not cause the same kind of non-uniformity across the wafer that may occur when the droplets are dispensed on the wafer surface.

Unwanted spontaneous evaporation is therefore much reduced in the method of the disclosed technology. Only during transport of the chip 4 from the dispenser 10 to the wafer location 2, such unwanted evaporation may still occur. Therefore, according to one embodiment, the volume of the alignment liquid that is dispensed on each chip is not the same for every chip but this volume is adapted to the factors which influence the unwanted evaporation of the droplet during its transport to the wafer. These factors are mainly the surface area of the chip's bonding surface, the distance from the dispenser 10 to the wafer location 2, the speed of the holder 5 during its movement from the dispenser to the wafer location. Other factors are the temperature, pressure and relative humidity of the environment in which these manipulations take place. According to this embodiment, a calculation of two liquid volumes V1 and V2 is performed for each chip:

V1 is the required volume of the droplet 12' in order for the self-aligned chip to be suspended above the bonding site 2 at a given height h (as shown in FIG. 1G). If all chips have the same shape and size of the bonding surface, the value V1 is the same for all the chips.

V2 is the volume that is expected to evaporate during the transport from the dispenser 10 to the wafer bonding site 2, taking into account one or more of the above-described factors, at least including the distance between the dispenser and the bonding sites. This value is different for each chip, as each chip is bonded to a different bonding site 2 on the wafer.

According to this embodiment, the volume of the droplet 12 supplied by the droplet dispenser for each chip is then V1+V2, thereby ensuring that each chip is suspended at the correct height h at the moment when the controlled evaporation and bonding process begins. This calculation presupposes that there is no difference in volume between the droplets 12 and 12' (i.e., it assumes that the droplet 12 is entirely transferred to the chip). Alternatively, in cases where a difference between droplets 12 and 12' can be computed, it can be taken into account in the calculation of V1.

The droplet dispenser 10 applicable in the latter embodiment is equipped with control means for controlling the volume of alignment liquid that is provided so that this volume is equal to the pre-calculated value V1+V2. These control means therefore have to be configured to control the volume of the droplet 12 to an accuracy in the order of millilitres or less, depending on the dimensions of the chips. Droplet dispensers are known in the art which are equipped with control means capable of this accuracy.

In the above description, the term "droplet" has no bearing on the absolute value of the volume denoted by this term. In the context of this specification, a "droplet" is any volume that is capable of being supported at an orifice of a droplet dispenser (for example at the extremity of a tube 11).

The orifice is preferably but not exclusively oriented upwards during the method. The orifice may also be held at a tilted angle or even horizontally, provided that the droplet 12 can remain attached to the orifice.

The bonding sites 2 may be locations on the wafer itself, as shown in the above description and the appended drawings. These sites may, however, also be the upper surfaces of previously bonded chips or portions of the upper surfaces. In other words, the method of the disclosed technology is applicable also to the aligning and bonding of a chip to form a stack of chips assembled to a landing wafer, as applied in 3D stacking or 2.5D stacking. The meaning of a "landing wafer" in the present context is therefore twofold: it can refer to a blank wafer on which no chips have been bonded. It can also refer to a wafer on which one or more chips have been previously bonded, either by the method of the disclosed technology or by any other method, and wherein the bonding sites are located on the upper surface of one or more of the previously bonded chips. The previously bonded chips can be large interposer chips onto which a plurality of microchips are bonded by the method of the invention (2.5D), or they can be previously bonded microchips onto which further microchips are stacked by the method of the invention (3D).

While the disclosed technology has been illustrated and described in detail in the drawings and foregoing description, such illustration and description are to be considered illustrative or exemplary and not restrictive. Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

What is claimed is:

1. A method of bonding one or more individual semiconductor chips to a landing wafer, each chip comprising a chip bonding surface that is at least partially wettable by an alignment liquid, the landing wafer comprising one or more bonding sites respectively configured to receive the one or more chips, the one or more bonding sites comprising a landing wafer bonding surface that is at least partially wettable by the alignment liquid, the method comprising:
   supplying the alignment liquid through an orifice of a droplet dispensing apparatus, at least part of a volume of the alignment liquid attached to the orifice extending outward from the orifice;
   moving a chip so that the chip bonding surface of the chip approaches the volume of the alignment liquid attached to the orifice until the volume of the alignment liquid spreads across the chip bonding surface or a wettable portion thereof, while being contained to the chip bonding surface;
   after the volume of the alignment liquid spreads across the chip bonding surface or wettable portion thereof, positioning the chip above the landing wafer bonding surface of a bonding site of the landing wafer in such a manner that the alignment liquid spreads out across both the chip bonding surface and the landing wafer bonding surface or wettable portions thereof, while being contained to the chip bonding surface and the landing wafer bonding surface;
   thereafter releasing the chip so that the alignment liquid establishes a self-alignment of the chip to the bonding site of the landing wafer,
   optionally repeating the supplying, moving, positioning, and releasing steps for additional chips; and
   bonding the one or more chips to the one or more bonding sites of the landing wafer, respectively.

2. The method according to claim 1, wherein the chip bonding surface comprises a surface of a bonding layer of the chip and the landing wafer bonding surface comprises a surface of a bonding layer of the landing wafer.

3. The method according to claim 2, wherein bonding the one or more chips to the one or more bonding sites comprises applying a direct bonding or hybrid bonding technique.

4. The method according to claim 1, wherein
the chip is held with a chip holder when the alignment liquid is supplied through the orifice of the droplet dispensing apparatus, the chip bonding surface of the chip oriented away from the chip holder.

5. The method according to claim 1, wherein the droplet dispensing apparatus comprises a tube through which the alignment liquid is supplied, and wherein the orifice is an opening at the outer extremity of the tube.

6. The method according to claim 5, wherein the tube is held in a vertical position with the volume of the alignment liquid attached at the top of the tube.

7. The method according to claim 1, wherein the volume of the alignment liquid attached to the orifice is calculated for each of the one or more chips, as the sum of V1 and V2, wherein V1 is a volume required between the chip bonding surface and the landing wafer bonding surface in order for the chip to be self-aligned at a given height (h) above the landing wafer bonding surface, and wherein V2 is an amount of liquid expected to evaporate between the moment when the alignment liquid is first attached to the chip and the moment when the chip is released from the chip holder.

8. The method according to claim 7, further comprising calculating V1, wherein calculating V1 comprises calculating a difference between the volume of the alignment liquid attached to the orifice and the volume of the alignment liquid dispensed on the chip bonding surface.

9. The method according to claim 1, wherein the landing wafer bonding surface comprises a portion of an upper surface of a chip that was previously bonded to the landing wafer.

10. The method according to claim 1, wherein, when the alignment liquid is supplied through the orifice of the droplet dispensing apparatus, the volume of the alignment liquid becomes attached to the orifice through surface tension of the alignment liquid.

11. The method according to claim 1, wherein positioning the chip above the landing wafer bonding surface comprises moving the chip away from the orifice.

* * * * *